| United States Patent [19] | [11] 4,093,502 |
|---|---|
| Hirabayashi et al. | [45] June 6, 1978 |

[54] PROCESS FOR SYNTHESIZING AND GROWING SINGLE CRYSTALLINE BERYL

[75] Inventors: Masaya Hirabayashi, Yokaichi; Naoki Omi; Yuji Nakano, both of Kyoto; Tetsuro Oshiba, Yokaichi, all of Japan

[73] Assignee: Kyoto Ceramic Co., Ltd., Kyoto, Japan

[21] Appl. No.: 657,595

[22] Filed: Feb. 12, 1976

[30] Foreign Application Priority Data

Feb. 18, 1975 Japan .................................. 50-20692

[51] Int. Cl.² ............................................. B01J 17/04
[52] U.S. Cl. .................................... 156/624; 423/624
[58] Field of Search .................. 156/624; 23/296, 300, 23/301, 305 R; 423/122, 624

[56] References Cited

U.S. PATENT DOCUMENTS

| 3,234,135 | 2/1966 | Ballman | 156/624 |
| 3,341,302 | 9/1967 | Flanigen | 156/624 |
| 3,768,983 | 10/1973 | Elkins | 23/305 |

*Primary Examiner*—Hiram H. Bernstein
*Attorney, Agent, or Firm*—Spensley, Horn & Lubitz

[57] ABSTRACT

A process for synthesizing single crystalline beryl out of a molten salt is disclosed. The process comprises the steps of providing at least one flux to which is added the component oxides of beryl and optionally a colorant. The mixture thus obtained is heated at a temperature higher than the melting point of the flux to thereby form a molten salt. After the formation of the molten salt, the salt is cooled below the temperature sphere of beryl formation and is thereafter reheatd and again melted. At this point beryl crystals are added to the molten salt which thereby form single crystalline beryl from the molten salt. By the use of the process of the present invention, superior quality single crystalline beryl is produced economically and at a high yield rate.

27 Claims, 3 Drawing Figures

PROCESS FOR SYNTHESIZING AND GROWING SINGLE CRYSTALLINE BERYL

BACKGROUND OF THE INVENTION

1. Field of the Invention

The present invention relates to the field of processes for synthesizing or otherwise forming and growing single crystalline beryl, and more specifically, to a unique process which utilizes specific fluxes and specific method steps of heating and cooling the molten salt used to form the beryl crystals.

2. Prior Art

Recently there has been an increased demand for synthetic beryl which has found its application in gemstone members represented by emeralds. Moreover, aside from the aesthetic quality of the emeralds in jewelry and the like, synthetic beryl has also been used in microwave device members and other industrial devices. Among the processes heretofore introduced for synthesizing the beryl are a hydrothermal process and a molten salt process which utilizes a flux.

The molten salt process has a distinct advantage over the hydrothermal process in that the molten salt process saves considerable working energy in the form of heat and pressure which are otherwise required for the growing of the crystals under the hydrothermal process. Moreover, the molten salt process also simplifies the type of apparatus used to grow the crystals. The molten salt process is also far simpler than the hydrothermal process from the point of view of synthesizing procedures in that the hydrothermal process requires a hydrothermal reaction effected by maintaining an autoclave of complicated structure at high temperatures and pressure for a long period of time.

In the molten salt process, synthetic beryl are grown around beryl seed crystals by adding a flux to the beryl component oxides. The mixture is then heated at a temperature higher than that at which the fluxes are melted thereby forming the mixture into a molten salt. Beryl seed crystals are then placed in a molten salt while continuing with either of two heating procedures; in a first prior art embodiment the molten salt is maintained at a definite temperature range of a long period of time during which the growth of the beryl takes place. The other procedure is one in which the liquid i.e., the molten salt is cooled after having maintained the salt at a definite temperature for a certain period of time.

In this manner, the molten salt process makes it possible to form and grow single crystalline beryl by merely inserting seed crystals into the molten salt, heating the salt and maintaining the heating temperature for a comparatively short period at a temperature higher than the melting point of the flux, normally at a temperature range of 700° to 1,050° C.

Nevertheless, this molten salt process leaves the following problems yet to be solved:

1. The amount of beryl of high purity is small for the amount used in one batch of component oxides of the beryl. Namely, according to the molten salt process of the prior art, formation conditions for beryl formed and grown around the seed crystals are very unstable both in quality and quantity. This is thought to be due to the fact that paragenic materials such as green beryl ($BeAl_2O_4$), phenacite ($Be_2SiO_4$) and other crystobalite ($SiO_2$), etc. are likely to be formed in high percentages. It also happens not infrequently in an extreme case that paragenic materials are grown or produced and no beryl at all comes out. What is considerd the cause of this is that a change of intercombination of components BeO, $Al_2O_3$, and $SiO_2$ in the component oxides of beryl do not form the desired composition of beryl of three component types of $BeO \cdot Al_2O_3 \cdot 6SiO_2$ but forms two component types of $BeO-Al_2O_3$ (chrysoberyl) and $BeO-SiO_2$ (phenacite) or a single component type of $SiO_2$, depending upon the temperature of the molten salt. This is thought to be because the mineral-based substances combined and formed follow the order of stability in the temperatures of the substances. That is, it is considered that the cause seems to lie in the fact that chrysoberyl and phenacite are more predominantly stable, for example, in the neighborhood of the upper limits of the stable temperature sphere of formation of beryl and that chrysoberyl and phenacite are predominantly formed prior to the formation of beryl. Beryl, therefore, comes out later in order. This tendency has been more conspicuous in such a case as that of synthetic emeralds which contain a coloring component. It may also be said that in the prior art processes no idea has ever been proposed of systematically tackling these problems discussed hereinabove in connection with mineral substances formed from a molten salt and of producing beryl predominantly and effectively from the molten salt.

2. Seed crystals obtained from natural beryl had to be used for industrially producing beryl. Although beryl is formed without seed crystals, the amount of beryl formed as described hereinabove, is highly unpredictable. Therefore in order to realize reproducibility, recourse was had to the growth of seeds as an indispensable condition for forming synthetic beryl.

The present invention represents an advance in the art of beryl production and contains none of the aforementioned shortcomings associated with prior art methods. Moreover, the need for seed crystals is eliminated.

BRIEF SUMMARY OF THE INVENTION

A primary object of the present invention is to provide a process for forming and growing single crystalline beryl out of a beryl-forming molten salt in preference to other materials contained therein.

Another object of the invention is to provide such a process for forming synthetic single crystalline beryl which makes it possible to dispense with beryl seed crystals around which synthetic single crystalline beryls had been grown in the past.

Yet another object of the present invention is to provide a process which is excellent in yield rates and which makes it possible to obtain synthetic single crystalline beryl in high quality.

The novel features which are believed to be characteristic of this invention, both as to its organization and method of operation, together with further objectives and advantages thereof, will be better understood from the following description considered in connection with the accompanying drawings in which the presently preferred embodiments of the invention are illustrated by way of example. It is to be expressly understood, however, that the drawings are for the purpose of illustration and description only and are not intended as a definition of the limits of the invention.

DETAILED DESCRIPTION OF THE INVENTION

Figure 3:
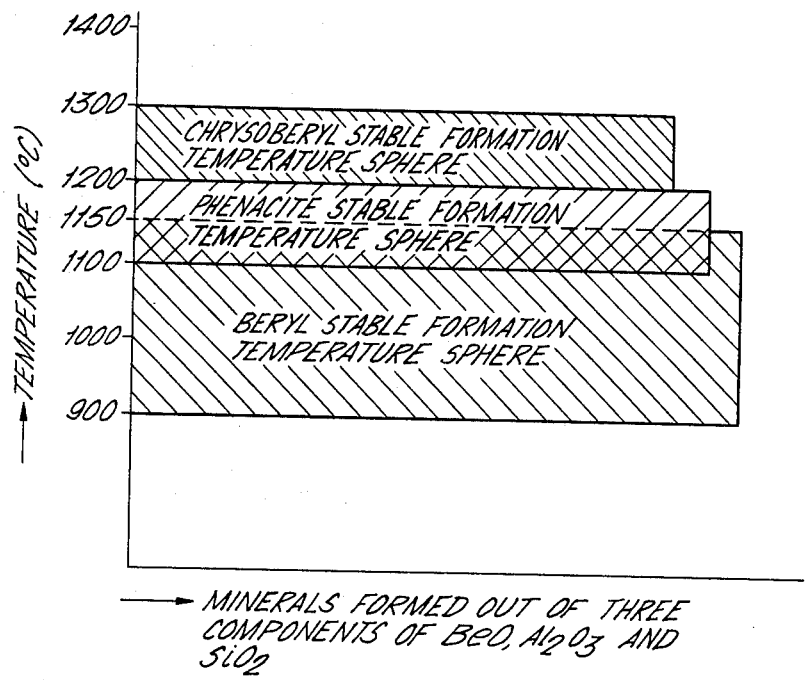
FIG. 3 is a graphical representation of temperature distribution showing a temperature sphere of stable growth for the molten salts of chrystoberyl, phenacite and beryl.

Experiments have shown that, when $V_2O_5$ is used as the flux, a temperature range of 1,200° to 1,300° C in the temperature of the molten salt is the most stable temperature sphere for chrysoberyl growth; a temperature range of 1,100° to 1,200° C is the most stable temperature sphere for phenacite growth, and a temperature range of 900° to 1,150° C is the most stable temperature sphere for beryl. This is shown in FIG. 3. Of course, it is to be understood, that these stable temperature spheres have no strict critical boundary between their respective upper and lower limits and permit more or less fluctuation depending upon variations of the components of the fluxes used. However, when there is a preference range of the minerals to be formed in accordance with such temperature spheres, and if beryl is grown by lowering the temperatures gradually from the neighborhood of the high temperature range of 1,250° C as is the case with conventional processes, beryl is last in the order of formation to chrysoberyl and phenacite. Moreover, insertion of seed crystals is possible only in the most stable temperature sphere of beryl growth, and because the growth of beryl is effectively achieved only at a temperature in the range of 1,050° to 900° C (in the neighborhood of the lower limit of the stable temperature sphere of beryl) at which component oxides of beryl such as BeO, $Al_2O_3$, and $SiO_2$ are low in their ability to melt into the flux, the beryl crystals are very slow in their velocity of formation and thereby take much time in growing. Thus, beryl crystals are exceedingly low in their efficiency of formation.

With this in mind, this invention is used to reverse the order of formation in the conventional processes wherein the order of formation of chrysoberyl, phenacite, beryl and other paragenic materials out of the molten salt is transferred from the high temperature to the low temperature sphere by cooling the molten salt below the lower temperature limit (about 900° C) of beryl formation before the formation of beryl and heating the same thereafter to the upper temperature limit (about 1,150° C) of beryl formation or to a slightly higher temperature. This accelerates the formation of natural nuclei of beryl by giving an ample chance of preferential formation of beryl to the molten salt heated to the above temperature. This invention also contemplates adding beryl crystals to the molten salt, thereby bringing immediately the state of beryl formation in the molten salt to saturation so as to control the formation of nuclei of the other formable paragenic materials therein. The steps of the present invention are also used to make the formation of beryl out of the molten salt predominant. The beryl crystals mentioned herein should not be taken for crystal nuclei having a main function peculiar to conventional seeds, but, as mentioned above, such crystals should be understood to be an accelerating medium or a stabilizing medium for the formation of natural nuclei of of beryl. According to this invention, excellent single crystalline beryl formed out of the molten salt takes place at places other than around the added beryl crystals and which constitutes the principal part of the crystalline beryl formed. This will become apparent as discussed in more detail herein.

In addition to the process steps centering around the described heating procedure, this invention further includes a particular combination of fluxes which can contribute toward improvement in quality of single crystalline emerald and to increased yields of the same. Namely, this combination of fluxes is characterized in that $V_2O_5$ is used as a main flux and that one or more fluxes selected from the group of alkaline metallic salts capable of becoming any of lithium oxide ($Li_2O$), sodium oxide ($Na_2O$), and potassium oxide ($K_2O$) in a molten state conjugate to $V_2O_5$ are used as the auxiliary flux. In practical application of those alkaline metallic salts mentioned above, the respective carbonates of the salts are preferably chosen from the viewpoint of their commercial availability and of their easy handling. For example, it is desirable to use one or more of any $Na_2O_3$, $Li_2O_3$, and $K_2O_3$ in amounts less than 3% by weight in combination with the $V_2O_5$. This mixture has been found to be more useful than the exclusive use of $V_2O_5$ alone in that the mixture increases the yield of single crystals and improves the quality of the crystals as will be discussed hereinafter. Accordingly, a combination of the above fluxes provides a new and improved result in the production of beryl crystals. Of course, it is to be understood that any one of the above-identified oxides can be used alone and when only one oxide is used the preferable one is $V_2O_5$. $V_2O_5$ has been found to possess unique characteristics which give desired temperature formation sphere to beryl.

A description will now be presented of this invention with reference by way of example to a process for synthesizing emerald by uses of $Cr_2O_3$ as a colorant or dopant. Concerning the component oxides of beryl and the flux there is no difference between this invention and the conventional components except for the combination of particular fluxes that will be described in Example 5 and the specific method steps which utilize heating and cooling at specific points in the process. Natural beryl powder which is relatively low priced and of high quality is comprised of oxides of BeO, $Al_2O_3$, and $SiO_2$ which are mixed in a stoichiometrical ratio so as to obtain a composition ratio of emerald which is well known in the art. It is understood that other compositions can be used and tailor depending upon the desired properties of the final crystal. To the resultant mixture is added $Cr_2O_3$ which constitutes the base color of emerald green, and if necessary, an auxiliary colorant consisting of transistion metallic oxides selected from the group consisting of NiO, $Fe_2O_3$, CoO, and the mixtures thereof are added to the first mixture thus obtained. To the mixture of the beryl forming ingredients, there is further added as a flux one or more of the compounds selected from the group consisting of $V_2O_5$, molybdate, $K_2Mo_2O_7$, $Na_2Mo_2O_7$, $Li_2Mo_2O_7$, $PnMo_4$, tungstate such as $Na_2W_2O_7$, $Li_2W_2O_7$, $PbWO_4$, and $B_2O_3$. These compounds are placed in a platinum crucible or other fireproof container and are melted by being heated to a temperature higher than the melting point of the fluxes used. In the preferred embodiment, an electric heating means such as an electric furnace is used so as to make the heating procedure accurate and easy to control.

A detailed description will now be presented of the heating procedure characteristic of the present invention with reference to the accompanying drawings herein.

Referring to the process according to the first embodiment of the present invention, BeO, $Al_2O_3$, and $SiO_2$ which were used as the component oxides of beryl for synthesizing emerald and $Cr_2O_3$ (if necessary, additionally as an auxiliary colorant) are mixed in a specified stoichiometrical ratio corresponding to that of emerald. The colorant may optionally be mixed with natural beryl powder rather than the constituents of the beryl. $V_2O_5$ in the form of a flux is provided in amounts suitable for the solubility of emeralds, the specific amount being a matter of choice. The flux, $V_2O_5$, is charged into a platinum crucible, and the component oxides of beryl together with the colorant (or natural beryl powder) are added to the flux and melted. This is done while the flux is initially being heated to a temperature of about 1,400° C which is above its melting point causing all of the components to melt. Optionally, the flux is mixed with the component oxides of beryl and the mixture obtained is charged into the crucible from the outset, heated and melted. By taking either of the above two procedures, the component oxides together with the flux are formed into a molten salt. By timing the completion of formation of the molten salt, the salt is cooled to below the temperature sphere of 900° to 1,150° C at which emerald is formed. For example, it is cooled to a temperature in the range of 500° to 850° C. When an electric heating means is used, such as, for example, an electric heaters, this cooling is effected in a short time by stopping the supply of power to the electric heater. Cooling may also be effected at such velocities as that which is possible within the range of natural air cooling and requires no particular forced cooling. Thereafter, the cooled molten salt is reheated to the upper temperature sphere within which stable formation of emerald is effected. This temperature has been found to be 1,150° C or slightly higher (10°–100° C) than 1,150° C. The range of stable emerald growth of 1,150° C to about 1,250° C is referred to herein as the "upper region of the temperature sphere of beryl formation." This heating is readily carried out by resupply of power to the electric heating means. The slightly higher temperature mentioned above is the "temperature lowering range" (to be more fully described herinafter) shown in the third embodiment, the temperature lowering range being 10°–100° C, preferably 30°–50° C higher than 1,150° C.

The cooling and reheating described herein is used to produce a preferential formation order of emerald in the steps of forming and growing by reversing the order of formation of chrysoberyl, phenacite, emerald and other paragenic minerals out of the molten salt. Namely, the respective temperature spheres of stable formation of chrysoberyl, phenacite, and emerald in the molten salt are shown in FIG. 3 and have now moved from the higher temperature side to the lower temperature side according to their order because of the heating and cooling steps referred to hereinabove. If the temperature spheres are slowly lowered from the neighborhood of 1,400° C after the completed formation of the molten salt as is the case with conventional processes, the minerals are formed in the order of chrysoberyl, phenacite and emerald, and it is difficult to preferentially form emerald out of the molten salt without the aid of seed crystals being added. Moreover, as stated previously, it is not easy to maintain a constant quantity of emerald formed and grown even by use of the seed crystals. However, according to the present invention, it is possible to make the forming of $3BeO \cdot Al_2O_3 \cdot 6SiO_2$ in this molten salt maximized by the entire range of emerald formation by heating after cooling the molten salt to below the lower limit of the range of emerald formation, and by heating within the range of temperature. This not only completely departs from the temperature sphere of chrysoberyl formation, but also isolates from the principal range of temperature sphere the phenacite formation.

In practicing the above heating procedure which includes the range in which the lower and upper limits of the temperature sphere of phenacite and emerald formation conflict with each other, there seems to be a small chance that the phenacite will be formed. This chance can be essentially ruled out by adding natural or synthetic beryl crystals to the molten salt to thereby accelerate the formation of natural nuclei of emerald and thereby keeping the molten salt in an oversaturated state thus controlling the formation of phenacite nuclei. The above-mentioned addition of beryl crystals may be carried out respectively in the neighborhood of starting slow cooling in the case of the first embodiment wherein the molten salt is subjected to slow cooling immediately after it is reheated, and at any desired point of time within the holding period in the case of the second embodiment wherein the molten salt is maintained at the same temperature for a certain period of time after it is reheated.

A description will now be made of the most desirable process for forming and growing emeralds out of molten salt with reference to the first, second and third embodiments, and examples corresponding to the respective processes will be shown in FIGS. 1 and 2 by curves $a$, $b$ and $c$. This invention includes these three processes but does not exclude a temperature grading method which will be discussed hereinafter.

The first embodiment is concerned with the process designated by curve $a$ in FIG. 1 in which the molten salt first subjected to the reheating process is slowly cooled with a mild temperature gradient (preferably below 1° C/hour i.e., 1° C/hour to about 0.5° C/hour) immediately after the reheating and in which the point of time to add beryl crystals is set in the neighborhood of the starting point of slow cooling.

Figure 1:
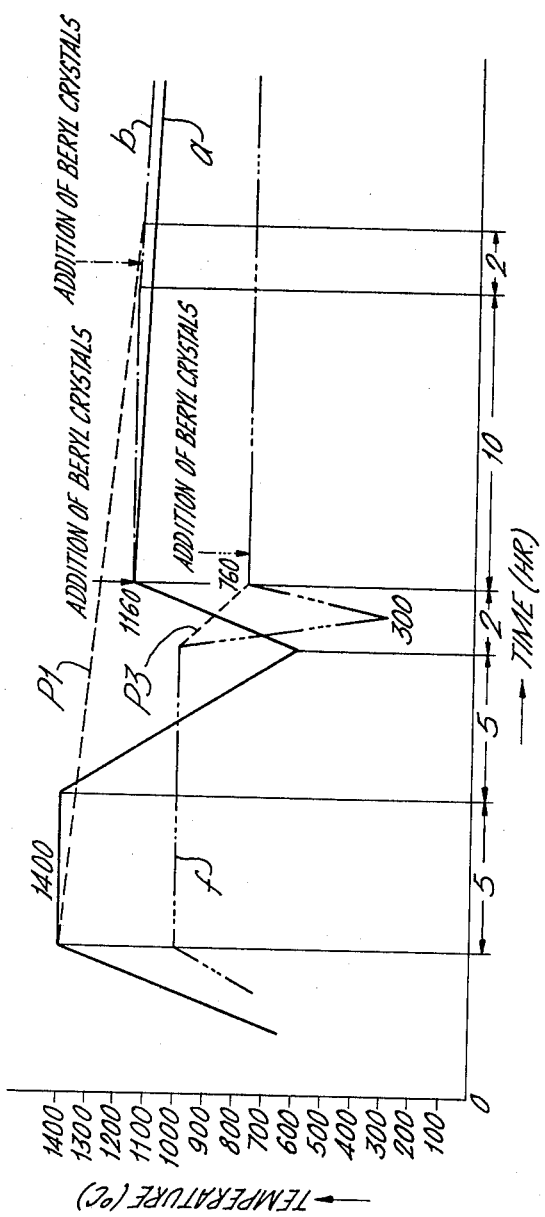
FIGS. 1 and 2 show the temperature-time characteristic of the molten salt according to the present invention.
Figure 2:
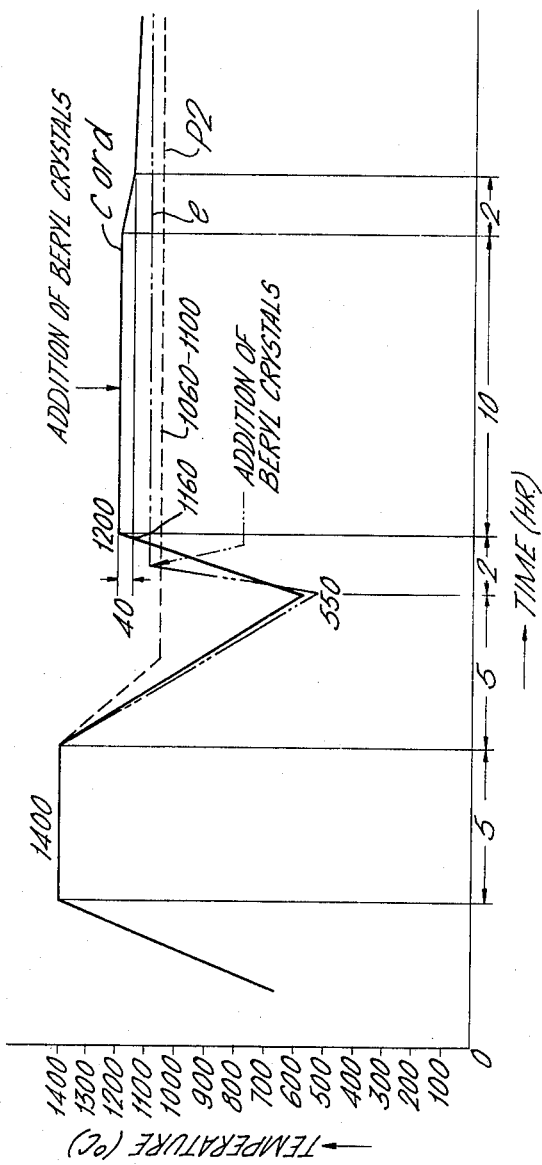

According to the second embodiment, the molten salt, as shown by curve $b$ in FIG. 1, is held at a temperature in the neighborhood of the upper limit of reheating temperature for some time (preferably for about ten hours) and the beryl crystals are added to the molten salt during this process of the holding period. The advantage brought about by the difference in the addition of crystals between the first and second embodiments, is that in the second embodiment, in which the molten salt is kept at the reheating temperature for a period of time, it is easier to equalize the temperature of the molten salt which results in far greater yields of single crystalline emerald than in the first embodiment of the present invention. In both these embodiments, because the addition of beryl crystals brings the growth conditions for natural nuclei of emerald in the molten salt into an oversaturated state, there is shown vigorous formation and growth of natural nuclei of emerald out of the molten salt not only around the added beryl crystals, but also in the places isolated from those crystals during the subsequent period of slow cooling. These beryl crystals are primarily intended to preferentially accelerate the development of natural nuclei of emerald and to stabilize the formation of the same over the whole of molten salt and are different from those seed crystals in the conventional processes which are intended to synthesize single crystalline emerald around themselves. Consequently, in the present invention, the beryl crystals do not require the use of especially costly emerald single crystals but synthesized beryl crystals can be used. Of course, it is not objectionable to use natural emerald crystals if no consideration is given to economy in cost. Accordingly, almost all the minerals formed around those beryl crystals are synthetic single crystalline emeralds. This is true with the other parts of the molten salt away from the area adjacent the added beryl crystals. Thus, this contributes toward a greatly increased yield of emeralds in the invention. This increase in yield will become more apparent in a concrete form from comparison between the examples of the invention and contrast examples which will later be described.

The added crystals can be collected and reused after the formation and growth of emerald is completed. In contrast to this, the seed crystals used in the conventional processes become cores of synthetic crystals and are inseparable from the emeralds which are produced. This recovery aspect represents a salient difference between the present invention and that of the prior art. The emerald crystals which play a role as seed crystals (either of natural or synthetic emerald) may, if necessary, be added in the process of slow cooling. Addition of the second emerald crystals is to intentionally develop the mass of synthetic emerald crystal.

The different between the third embodiment of the present invention from the first and second embodiments, is that the molten salt in the third embodiment is rapidly lowered in temperature within a certain temperature width before it is slowly cooled. To explain this point with reference to the curve $c$ or $d$ in FIG. 2, this temperature lowering range is set in such a manner that it becomes substantially equal to that temperature width range of 10°–100° C in the preceding reheating procedure which was added to the neighborhood of 1,150° C which is the upper limit of the temperature sphere of emerald formation, and that the lower limit of the temperature lowering range is substantially equal to 1,150° C which is the upper limit of the temperature sphere of emerald growth. The reason for this is to prevent the formation of phenacite by providing a substantial temperature difference to to the molten salt before emerald is grown out of the molten salt thereby increasing the saturation due to the added crystals and at the same time making the stable formation of phenacite pass rapidly. Namely, in the first and second embodiments, the setting of reheating temperature in the neighborhood of 1,150° C which is the upper limit of emerald formation temperature sphere can produce the desired results but setting of the temperature at a slightly higher point (10°–100° C higher), for example, at 1200° C provides a small chance of phenacite tending to grow even with the aid of the addition of emerald crystals. Accordingly, herein lies the significance of the described temperature lowering as a positive means of preferentially forming emerald out of the molten salt whose reheating temperature is raised in the manner described. Such rapid temperature lowering is effected by the control of power supply to the electric heating means in the same manner as done in the cooling procedure prior to reheating. The chance of natural nuclei being formed in the molten salt is accelerated by this temperature lowering procedure and stabilized by oversaturation. When the single crystalline emeralds grow out of the molten salt is increased too greast in number by such a vigorous state of development of nuclei of emerald being maintained, there is a possibility of the invididual crystalline emeralds becoming comparatively small in size. Caution must therefore be exercised to take as smooth a temperature lowering procedure as possible.

In the procedure for the subsequent slow cooling of the molten salt in the third embodiment of the present invention, it is only necessary to lower the molten salt to a specified temperature with a mild temperature gradient, and the seed emerald crystals may then be added during this temperature lowering step. The difference between the first and second embodiments will become apparent from those examples described hereinafter.

Described above are three preferred embodiments of the invention in which processes for forming and growing crystalline emeralds out of conventionally used beryl forming molten salt in accordance with this invention is shown by way of example. There is another process that substitutes the three processes described hereinabove and which is called a temperature grading method. According to the temperature grading method, a substantial temperature difference (30°–60° C) is provided between the top area and bottom area of the molten salt in the container, and emerald seed crystals are added to the molten salt on the lower temperature side and component oxides of beryl are placed in the molten salt on the higher temperature side. As is apparent from comparison between Example 5 and contrast Example 2, when emerald is synthesized by the temperature grading method from the molten salt to which beryl crystals were beforehand added (see Example 4), it will be demonstrated that this process provides a very high rate of yield compared to conventional temperature grading method known in the art.

Referring to the processes for growing synthetic emeralds in conjunction with the period of time during which single crystalline emeralds of the same size are obtained, the conventional molten processes, for example, require about 6 months. The processes of the present invention take only about 2 months and yield emerald in far superior quality. This is because the starting temperatures of the slow cooling of the molten salt according to the known processes is set at a relatively low temperature in the neighborhood of 1,050° C so as to evade the growth of paragenic materials as much as possible. In contrast thereto, the invention makes it possible to start slow cooling from a higher temperature in the neighborhood of 1200° C and thereby reduces the growth period with a substantial difference resulting in emerald yield. This is apparent from the fact that, according to the solubility curve of synthetic emerald in a $V_2O_5$ flux, the curve between 1,050° C and 1,200° C shows the far steeper rise than the curve for less than 1,050° C. Therefore, slow cooling of the molten salt as proposed by the present invention when the salt is formed beforehand and is heated in the neighborhood of 1,200° C means that the cooling of the molten salt which contains already in large quantities therein such a quantity of emerald as can eventually be formed out of the molten salt not only reduces the growth period of the emerald but is far superior in the yielding rate of the emerald to the prior art processes.

A device for practicing the present invention includes a platinum crucible, electric furnace, platinum-platinum radium thermocouple, platinum wire suspending means, and, if necessary, electric temperature control device (particularly capable of slow cooling). Assembly of the device and the above-identified members are well known in the prior art and will not be discussed herein.

The advantageous effect proposed by the present invention can be increased by a particular combination of fluxes, the effects being shown in Example 5. By the particular combination of fluxes, it is meant that a combination of $V_2O_5$ in the form of a primary flux with an auxiliary flux capable of becoming any of the following components: $Li_2O$, $Na_2O$ and $K_2O$ in a molten state conjugate to the $V_2O_5$. The auxiliary flux may also consist of any one or mixtures of alkaline metallic salts selected from any alkaline metallic salt group. When the primary flux and the auxiliary flux are used in combination, the effects produced by the combination increase yield and improve the quality of single crystalline emeralds and is far greater than those produced by the use of any single flux including $V_2O_5$ alone or other conventional fluxes or the combinations of $V_2O_5$ with other conventional fluxes other than those discussed hereinabove. The cause of this increase is thought to be the fact that the alkaline metallic salt reduces the viscosity of $V_2O_5$ in a proper amount and assists in the growth conditions for single crystalline emeralds. Also, this combination offers an advantage in that when hot nitric acid is used to facilitate disssolving and reusing of the flux in the subsequent step, dissolving velocity of the flux with respect to the hot nitric acid is enhanced to a much greater extent than the use of $V_2O_5$ alone. As a result, dissolving of the flux, namely separation and refinement of emeralds, is very much facilitated. Finally, removal of the flux attached to the surface of the synthetic single crystalline emerald is also facilitated. In point of easy availability and low cost, carbonate selected from $Li_2CO_3$, $Na_2CO_3$, and $K_2CO_3$ are normally used as the alkaline metallic salt in the present invention. Addition of up to 30% by weight of auxiliary flux to $V_2O_5$ is preferred as a mixing ratio in that an excessive addition above the 30% amount provides the possibility of the yield of emeralds being reduced. The effect produced by such a particular combination of fluxes will become apparent from the examples described hereinafter.

The invention has been described with reference to the process for synthesizing emeralds using $Cr_2O_3$ as a dopant or colorant, but the invention can equally be used to produce synthetic beryl for use in microwave and other industrial applications by the use of the same procedure without the use of $Cr_2O_3$. Moreover, as a description has been taken of the flux with reference to $V_2O_5$ by way of example, the use of other fluxes are also within the scope of the invention so long as the specific heating and cooling steps are followed. Because the fluxes vary in melting point in accordance with their types, and hence vary in the temperature which the fluxes form the molten salt initially, it is understood that a temperature gradient per hour for cooling, the upper limit of reheating temperature of the molten salt, subsequent temperature lowering width and the like may be properly selected in accordance with the flux to be used and that the specific temperature is to be selected in accordance with the flux. Characteristic advantages of the invention will be indicated below with reference to the embodiments of the invention set against contrast examples. Initially, the respective items in Examples 2-6 show the same contents as those mentioned in Example 1.

EXAMPLE 1 i. Embodiment and its corresponding curve in the diagrams:
First embodiment and its corresponding curve represented by $a$ ii. Component oxides, fluxes and their compounding:
Natural beryl powder: 20 g
(high in quality, namely more than 13% of BeO, more than 65% of $SiO_2$, and less than 3% in content of other impurities)
$V_2O_5$: 100 g
$Cr_2O_3$: 0.2 g iii. Temperature conditions for formation of molten salt:
The material in Item ii) was charged into a platinum crucible and heated and maintained at 1400° C for 5 hours.

iv. Cooling:
The material was cooled to 600° C 5 hours after the maintenance of heating temperature in Item iii).

v. Reheating:
2 hours thereafter, the material was reheated to 1160° C.

vi. Procedures taken after reheating:
After the material having been reheated to 1,160° C, natural beryl crystals were added and slowly cooled at a rate of 0.5° C per hour until the mixture temperature was 1,000° C. During the time (after a lapse of 320 hours) growing of synthetic single crystalline emerald was continued. Thereafter hot nitric acid was poured into the crucible and the flux was removed, i.e., the flux was dissolved by nitric acid during the dissolving treatment in about 50 hours. Synthetic single crystalline emeralds were obtained.

vii. Results and observations:
Single crystalline emerald (0.5–5mm) . . . about 70% (by weight)
Phenacite . . . about 20%
Crystobalite . . . about 10%
Yield of emerald $$\left( \frac{\text{quantity of emerald grown}}{\text{component materials of emerald}} \times 100 \right) \ldots 3-7\%$$

Refractive index . . . 1.568–1.563
Subrefractive index . . . 0.005
Specific gravity . . . 2.65

EXAMPLE 2 i. Second embodiment and represented by curve $b$
ii.–v. Same as in Example 1
vi. At the point of time at which the component material of emerald was maintained at 1160° C for 10 hours, natural beryl crystals were added and slowly cooled at a rate of 0.5° C per hour until finally the mixture fell in temperature to 1000° C, and treated with hot nitric acid in the same manner as in Example 1.
vii. Single crystalline emerald (1-7 mm) . . . about 90%
Phenacite . . . less than 10%
Refractive index, subrefractive index and specific gravity are the same as in Example 1.

EXAMPLE 3 i. Third embodiment and represented by curve $c$
ii.–iv. Same as in Example 1
v. After a lapse of two hours, reheating to 1200° C
vi. After the material was left to stand at 1200° C for 10 hours, natural beryl crystals were added, and two hours thereafter the mixture thus obtained was lowered in temperature to 1160° C, i.e., at the rate of about 20° C/hour. Thereafter, the mixture was slowly cooled to 1000° C at a rate of 0.5° C per hour and subjected to dissolving treatment with hot nitric acid for about 50 hours.

vii. Single crystalline emerald
(2–10 mm) . . . nearly most part of the quantity obtained
Phenacite . . . in small quantities
Yield of emerald . . . 7–12%
Refractive index, subrefractive index and specific gravity are the same as in Example 1.

EXAMPLE 4 i. Sixth embodiment and represented by curve $d$
ii. Natural beryl powder . . . 20 g
   $V_2O_5$ . . . 80 g
   $Li_2CO_3$ . . . 20 g
   $Cr_2O_3$ . . . 0.2g
iii. and iv. Same as in Example 1
v. and vi. Same as in Example 3 but treated with hot nitric acid for 3 hours.
vii. Single crystalline emerald (2–10 mm) . . . mostly
Phenacite and other paragenic minerals . . . in very small quantities
Yield of emerald . . . 10–15%
Refractive index, subrefractive index and specific gravity are the same as in Example 1.

EXAMPLE 5 i. Fourth embodiment and represented in curve $e$
ii. Beryl powder . . . 12 g
   $V_2O_5$ . . . 50 g
   $Li_2Mo_2O_7$ . . . 50 g
   $Cr_2O_3$ . . . 0.2g
iii. The above material was heated at 1400° C and left to stand at the same temperature for 5 hours.
iv. 5 hours thereafter, the mixture was cooled to 550° C.
v. Then, after a lapse of 1 hour, the mixture was reheated to 1100° C.
vi. At the point of time at which the mixture was reheated to a temperature of 1100° C, beryl crystals were added. The upper part of the crucible was held at a temperature of 1060° C and emerald seed crystals were suspended and immersed in the mixture in the high temperature area (i.e., the lower part of the crucible which was kept at 1100° C, in which part a white platinum net having junk emeralds therein was placed). The emeralds were kept placed in this state for about one month to grow single crystalline emeralds. Thereafter, the emeralds grown were treated with hot nitric acid to remove the flux.
vii. Crystalline emeralds alone were grown and inclusion of other crystals was scarcely noticed.
Yield of emerald . . . about 3%
Refractive and subrefractive indexes, and specific gravity were the same as in Example 1.

EXAMPLE 6 i. Second embodiment and represented by curve $f$
ii. Natural beryl powder . . . 20 q
   $Na_2MO_2O_7$ . . . 100 q
   $Cr_2O_3$ . . . 0.2 at q
iii. The material in Item ii) was heated at 1000° C and left to stand for ten hours.
iv. One hour thereafter, the mixture was cooled to 300° C.
v. Thereafter, after a lapse of 1 hour, the mixture was reheated to 760° C.
vi. At the point of time at which the mixture was reheated to 760° C, beryl crystals were added and left to stand for 10 days at 760° C to continue with growing.
Thereafter, the crystals grown were treated with hot nitric acid.
vii. At the same time as emerald was grown on the surface of beryl, single crystalline emeralds of less than 2 mm each were crystallized in large quantities.
Yield of emerald . . . about 3%
Refractive index . . . 1.564–1.561
Subrefractive index . . . 0.003
Specific gravity . . . 2.64–2.65

CONTRAST EXAMPLE 1 i. Corresponding example and curve:
   Example 1 and curve is represented by P 1
ii. Component material of emerald, fluxes and their compounding: Same as Example 1
iii. Temperture conditions for forming molten salt:
    Same as Example 1
iv. Cooling: None
v. Reheating: None
vi. Subsequent procedures:
    After a lapse of 24 hours, molten salt heated to 1,400° C was slowly cooled to 1,160° C, at which temperature beryl crystals were added to the molten salt and slowly cooled to 1,000° C at a rate of 0.5° C per hour. After the emeralds grown having been subjected to dissolving treatment with hot nitric acid for 50 hours, the following results were obtained.
vii. Results and observations:
    Single crystalline emerald . . ; in very small quantities
    Chrysoberyl . . ; about 10%
    phenacite . . . about 70%
    Crystobalite . . about 20%
    Yield of emerald . . . than 0.5%

CONTRAST EXAMPLE 2 i. Corresponding example and curve:
   Example 5 and curve represented by P 2
ii. Component oxides of emerald, fluxes and their compounding; and
iii. temperature conditions for formation of molten salt: Same as in Example 5
iv. Cooling; and v. Reheating: None
vi. Subsequent procedures:
    The molten salt was left to stand at 1,400° C for 3 hours, and soon thereafter, the upper part of molten salt in the crucible was maintained at 1060° C and beryl seed crystals were suspended to be immersed in the molten salt, while a platinum net having junk emeralds therein was placed in that lower part of the molten salt in the crucible which was maintained at 1100° C and left to stand in this state for about one month, to grow single crystalline emeralds.
vii. Results and observations:
    Single crystalline emerald also grew on the surfaces of inserted emerald crystals but at the same time phenacite was crystallized in large quantities.

CONTRAST EXAMPLE 3 i. Corresponding example and curve:
Example 6 and curve represented by P 3
ii. Component oxides of emerald, fluxes and their compounding: Same as in Example 6
iii. Temperature conditions for formation of molten salt: Same as in Example 6
iv. Cooling and reheating: None
vi. Subsequent procedures:
The molten salt was left to stand at 760° C for 2 hours, and beryl crystals were inserted and left to stand for 10 days to continue with growing.
vii. Results and observations:
Little or no single crystalline emerald was found to grow on the surfaces of the beryl crystals inserted and phenacite was crystallized in large quantities.

Comparison between the examples of the invention and contrast examples provides the following conclusions:

1. Yield of single crystalline emerald according to the invention is markedly higher than that according to the conventional processes;
2. Single crystalline emerald has grown into large crystals;
3. Paragenic minerals other than emerald formed are small or extremely small in quantity;
4. The fifth embodiment is the best of all the embodiments both in quality and in yield of emerald. This substantiates the effects of fluxes produced by a combination of $V_2O_5$ and alkaline metallic salts;
5. The third embodiment that was subjected to temperature lowering procedure subsequent to reheating is higher both in quality and in yield than the one that has passed through no such procedure;
6. The emerald provided by the second embodiment has improved both in quantity and in yield over that of the first embodiment. The reason for this is that maintenance of the molten salt at reheating temperature makes it possible for the molten salt to keep its temperature uniform.
7. The fourth embodiment is as excellent in yield of single crystalline emerald as the first embodiment;
8. The process according to the invention makes it possible to obtain the advantages described above in a far shorter period of time than the conventional processes; and
9. The conventional processes in the contrast examples make it impossible to prevent not only a reduction in the quality and yielding rate of single crystalline emerald formed but also in the development of a large quantity of paragenic minerals.

Recourse was had to the use of natural beryl powder of high quality as the component material used in the examples illustrated, but the alternative use of powdered oxides of high purity (BeO wt. 14%, $Al_2O_3$ wt. 19%, $SiO_2$ wt. 67% which represents a stoichiometrical mixing ratio for obtaining beryl) would produce the same results.

It is to be understood that fluxes, auxiliary colorants other than those used in the embodiments or the fluxes and auxiliary colorants selected from those specified in the scope of the invention may also be used and that the invention is not limited to the embodiments illustrated but many other modifications, substitutions, and additions may also be made within the scope of the invention.

As will have been understood from the description and embodiments so far given, this invention is extremely useful as a process for synthesizing single crystalline beryl in that the invention will greatly contribute toward a marked increase in yield, improvement in quality, reduction in the growth period and the resulting cost saving, in addition to the possession of the advantages inherent to the conventional molten salt process, by applying simple heating procedures to the process for synthesizing single crystalline beryl according to the conventional molten salt process or by a particular combination of the fluxes to be used.

What is claimed is:

1. A process for forming a single crystalline beryl out of a molten salt comprising the steps of:
    (a) adding the component oxides of beryl to a flux to form a mixture;
    (b) heating said mixture to a temperature higher than the melting point of said flux so as to form a molten salt;
    (c) cooling said molten salt to a temperature below the temperature of beryl formation;
    (d) reheating said salt to the upper temperature region of beryl formation for a sufficient length of time so as to preferentially form single crystalline beryl; and
    (e) cooling said salt and recovering said single crystalline beryl therefrom.

2. The process according to claim 1 wherein said component oxides of beryl consist essentially of BeO, $Al_2O_3$, and $SiO_2$.

3. The process according to claim 1 wherein said component oxides of beryl consist essentially of
    BeO . . . 14 wt. percent
    $Al_2O_3$ . . . 19 wt. percent
    $SiO_2$ . . . 67 wt. percent 4. The process according to claim 1 wherein said flux is $V_2O_5$.

5. The process according to claim 1 wherein said flux is $V_2O_5$ plus an additional flux selected from the group consisting of lithium oxide-forming metallic salt, sodium oxide-forming metallic salt, potassium oxide-forming metallic salt and mixtures thereof.

6. The process according to claim 5 wherein said metallic salt is present in an amount up to 30% by weight of said total flux used.

7. The process according to claim 1 wherein said molten salt is cooled in step (c) to a temperature below 900° C.

8. The process according to claim 7 wherein said molten salt is cooled in step (c) to a temperature of from about 500° to 850° C.

9. The process according to claim 1 wherein said molten salt is cooled in step (c) at the rate of about 1° C/hour.

10. The process according to claim 1 wherein said salt is reheated in step (d) to a temperature of about 1150° C to about 1250° C.

11. A process for forming single crystalline beryl out of a molten salt comprising the steps of:
    (a) mixing beryl-forming ingredients with a flux, said flux selected from the group consisting of $V_2O_5$, lithium oxide-forming metallic salt, sodium oxide-forming metallic salt, potassium oxide-forming metallic salt and mixtures thereof to form a mixture;

(b) heating said mixture to a temperature higher than the melting point of said flux so as to form a molten salt;

(c) cooling said molten salt to a temperature less than 900° C;

(d) reheating said mixture to a temperature of about 1150° C to about 1250° C for a sufficient length of time so as to preferentially form single crystalline beryl; and (e) cooling said salt and recovering said single crystalline beryl therefrom.

12. A process for forming single crystalline beryl out of a molten salt comprising the steps of:
(a) adding beryl-forming ingredients to a flux to form a mixture, said beryl-forming ingredients selected from the group consisting of component oxides of beryl, beryl powder and mixtures thereof;
(b) heating said mixture to a temperature higher than the melting point of said flux so as to form a molten salt;
(c) cooling said molten salt to a temperature below the temperature of beryl formation;
(d) reheating said salt to the upper temperature region of beryl formation;
(e) adding beryl crystals to the reheated salt so as to encourage the growth of said single crystalline beryl; and
(f) recooling the resulting composition so as to recover said single crystalline beryl in high yields.

13. The process according to claim 12 wherein said molten salt is cooled in step (c) to a temperature below 900° C.

14. The process according to claim 13 wherein said molten salt is cooled in step (c) to a temperature of from about 500° to 850° C.

15. The process according to claim 12 wherein said recooling takes place in step (f) at the rate of about 1° C/hour to 0.5° C/hour.

16. The process according to claim 12 wherein said salt is reheated in step (d) to a temperature of about 1150° C to about 1250° C.

17. The process according to claim 12 wherein said beryl crystals are added to the reheated salt when said recooling is initiated.

18. The process according to claim 12 wherein said beryl crystals are added to the reheated salt while maintaining said reheated salt in said upper temperature region of beryl formation for a predetermined period of time.

19. The process according to claim 12 wherein said salt is maintained in said upper temperature region of beryl formation for a predetermined period of time prior to the addition of said beryl crystals in step (e).

20. The process according to claim 12 wherein said recooling in step (f) takes place at two different rates, the first rate being faster than the second rate.

21. The process according to claim 20 wherein said first rate is about 20° C/hour and the second rate is about 0.5° C/hour.

22. A process for forming single crystalline beryl out of a molten salt comprising the steps of:
(a) mixing beryl-forming ingredients and a flux in a container to form a mixture, said beryl-forming ingredients selected from the group consisting of component oxides of beryl, beryl powder and mixtures thereof;
(b) heating said mixture to a temperature higher than the melting point of said flux so as to form a molten salt;
(c) cooling said molten salt to a temperature below the temperature of beryl formation;
(d) reheating said salt to the upper temperature region of beryl formation, said reheating being done so as to form a temperature gradient having a higher temperature area and a lower temperature area in said molten salt in said container;
(e) adding beryl crystals to the reheated salt so as to encourage the growth of said single crystalline beryl; and
(f) recooling the resulting composition so as to recover said single crystalline beryl in high yields.

23. The process according to claim 22 wherein the temperature difference between the higher temperature area and the lower temperature area is about 30°-60° C.

24. The process according to claim 22 wherein said beryl crystals are placed in the higher temperature area in said salt.

25. The process according to claim 22 wherein said flux is $V_2O_5$.

26. The process according to claim 22 wherein said flux is $V_2O_5$ plus an additional flux selected from the group consisting of lithium oxide-forming metallic salt, sodium oxide-forming metallic salt, potassium oxide-forming metallic salt and mixtures thereof.

27. The process according to claim 22 wherein said molten salt is cooled in step (c) to a temperature below 900° C.

* * * * *